US008184500B2

(12) United States Patent
Song

(10) Patent No.: US 8,184,500 B2
(45) Date of Patent: May 22, 2012

(54) SEMICONDUCTOR MEMORY DEVICE AND METHOD FOR OPERATING THE SAME

(75) Inventor: Choung-Ki Song, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 165 days.

(21) Appl. No.: 12/814,129

(22) Filed: Jun. 11, 2010

(65) Prior Publication Data

US 2011/0211413 A1 Sep. 1, 2011

(30) Foreign Application Priority Data

Feb. 26, 2010 (KR) .................. 10-2010-0018217

(51) Int. Cl.
*G11C 8/00* (2006.01)
*G11C 7/00* (2006.01)
(52) U.S. Cl. ............................. 365/230.03; 365/230.06
(58) Field of Classification Search ............. 365/230.03, 365/230.06, 191
See application file for complete search history.

(56) References Cited

U.S. PATENT DOCUMENTS

| 5,774,409 | A | * | 6/1998 | Yamazaki et al. | ........ 365/230.03 |
| 5,798,978 | A | * | 8/1998 | Yoo et al. | ...................... 365/193 |
| 5,903,514 | A | * | 5/1999 | Sawada | ...................... 365/233.1 |
| 7,830,741 | B2 | * | 11/2010 | Noh | ......................... 365/230.06 |

FOREIGN PATENT DOCUMENTS

KR 100780613 11/2007

* cited by examiner

*Primary Examiner* — Anh Phung
(74) *Attorney, Agent, or Firm* — IP & T Group LLP

(57) ABSTRACT

A semiconductor memory device includes a plurality of banks, a first bank selection driving control signal generation unit configured to generate a plurality of first bank selection driving control signals corresponding to the plurality of banks in response to an active command signal and an address signal, a second bank selection driving control signal generation unit configured to generate a plurality of second bank selection driving control signals corresponding to the plurality of banks in response to one of a read command signal and a write command signal and in response to the address signal, and an internal voltage driver configured to selectively drive a plurality of internal voltage terminals corresponding to the plurality of banks in response to the plurality of first bank selection driving control signals and the plurality of second bank selection driving control signals.

15 Claims, 4 Drawing Sheets

SEMICONDUCTOR MEMORY DEVICE AND METHOD FOR OPERATING THE SAME

CROSS-REFERENCE TO RELATED APPLICATIONS

The present application claims priority of Korean Patent Application No. 10-2010-0018217, filed on Feb. 26, 2010, which is incorporated herein by reference in its entirety.

BACKGROUND OF THE INVENTION

Exemplary embodiments of the present invention relate to a semiconductor design technology, and more particularly, to a circuit for generating an internal voltage of a semiconductor device.

Typical semiconductor devices including DRAM can include an internal voltage generator provided in a chip. The internal voltage generator is configured to generate a plurality of internal voltages having a variety of voltage levels. The internal voltage generator may use a power supply voltage VDD and a ground voltage VSS, which are supplied from outside the chip. The internal voltage generator supplies a plurality of interval voltages for the operations of an internal circuit of the chip.

Such internal voltages can include VBLP, VCP, VPP, and VCORE depending on the purpose. VBLP is a bit line precharge voltage, VCP is a cell plate voltage, VPP is a voltage for enabling a word line, and VCORE is a voltage for inputting the high data of a cell.

FIG. 1 is a block diagram illustrating a circuit for controlling a core voltage driver in a conventional memory device.

Referring to FIG. 1, the circuit for controlling a core voltage driver in the conventional memory device including a plurality of banks 30 to 37 includes a bank selection driving control signal generation unit 10, a driving control signal generation unit 50, and a core voltage driver 20. The bank selection driving control signal generation unit 10 is configured to generate a plurality of bank selection driving control signals RACTV<0:1>, RACTV<2:3>, RACTV<4:5>, and RACTV<6:7> corresponding to the plurality of banks 30 to 37 in response to an active command signal ACT_CMD and an address signal ADDRESS. The driving control signal generation unit 50 is configured to generate a driving control signal YBST in response to a read control signal CASP10RD corresponding to a read command signal READ_CMD and write control signals CASP10WTB4 and CASP10WTB8 corresponding to a wire command signal WRITE_CMD. The core voltage driver 20 is configured to selectively drive core voltage terminals corresponding to the plurality of banks 30 to 37 in response to the plurality of bank selection driving control signals RACTV<0:1>, RACTV<2:3>, RACTV<4:5>, and RACTV<6:7> and the driving control signal YBST.

Furthermore, the circuit for controlling a core voltage driver 20 includes a column selection control signal generation unit 40 that is configured to generate column selection control signals CASPBK<0:7> for selecting any one of banks 30 to 37, in which a column selection operation is to be performed, in response to the read control signal CASP10RD corresponding to the read command signal READ_CMD, in response to either one of the write control signals CASP10WTB4 and CASP10WTB8 corresponding to the write command signal WRITE_CMD, and in response to either of the bank selection control signals BANK<0:2> corresponding to the address signal ADDRESS.

The core voltage driver 20 selectively drives the core voltage terminals corresponding to the plurality of banks 30 to 37 in response to a plurality of driving control pulses ENPULSE01, ENPULSE23, ENPULSE45, and ENPULSE67, where the plurality of driving control pulses ENPULSE01, ENPULSE23, ENPULSE45, and ENPULSE67 are selectively toggled in response to activation of any one of the corresponding pair of bank selection driving signals of the plurality of bank selection driving control signals RACTV<0:1>, RACTV<2:3>, RACTV<4:5>, and RACTV<6:7>.

On the other hand, when the driving control signal YBST is activated, the core voltage driver 20 selectively drives the core voltage terminals corresponding to the plurality of banks 30 to 37 by toggling only a driving control pulse ENPULSE01, ENPULSE23, ENPULSE45, or ENPULSE67 corresponding to an activated bank selection driving control signal RACTV<0>, RACTV<1>, RACTV<2>, RACTV<3>, RACTV<4>, RACTV<5>, RACTV<6>, or RACTV<7> during the activation period.

That is, the selection of a core voltage terminal which is to be driven, from among the core voltage terminals corresponding to the plurality of banks 30 to 37, is determined depending on which signal is activated among the plurality of bank selection driving control signals RACTV<0> to RACTV<7>.

FIG. 2 is a timing diagram showing the operation of the circuit for controlling the core voltage driver in the conventional semiconductor memory device illustrated in FIG. 1.

Referring to FIG. 2, the circuit for controlling the core voltage driver in the conventional semiconductor memory device including the plurality of banks 30 to 37 sequentially activates the plurality of bank selection driving control signals RACTV<0> to RACTV<7>, as a plurality of active commands ACT_CMD (ACT0 to ACT7) corresponding to the plurality of banks 30 to 37 are sequentially activated. Accordingly, the plurality of driving control pulses ENPULSE01, ENPULSE23, ENPULSE45, and ENPULSE67 are sequentially toggled to sequentially drive the core voltage terminals corresponding to the plurality of banks 30 to 37.

When the plurality of active command signals ACT0 to ACT7 corresponding to the plurality of banks 30 to 37 are sequentially activated, the read command signal READ_CMD (RD0 or RD1) for reading data stored in the 0-th or first bank (30 or 31) is applied. Accordingly, the driving control signal YBST is toggled.

When the driving control signal YBST is toggled in response to the application of the read command signal RD0 or RD1 for reading the data stored in the 0-th or first bank 30 or 31, only the pulse ENPULSE01 corresponding to the 0-th and first banks 30 and 31 among the plurality of driving control pulses ENPULSE01, ENPULSE23, ENPULSE45, and ENPULSE67 is toggled, and the other pulses ENPULSE23, ENPULSE45, and ENPULSE67 corresponding to the second to seventh banks 32 to 37 are not toggled, until the bank selection driving control signals RACTV<0> and RACTV<1> corresponding to the 0-th and first banks, 30 and 31, among the plurality of bank selection driving control signals RACTV<0> to RACTV<7> are activated. Therefore, the core voltage terminals corresponding to the 0-th and first banks (30 and 31) may be driven with optimal efficiency.

However, when the read command signal RD0 or RD1 for reading the data stored in the 0-th or first bank 30 or 31 is applied to toggle the driving control signal YBST while the bank selection driving control signals RACTV<2> to RACTV<7> corresponding to the second to seventh banks 32 to 37 among the plurality of bank selection driving control signals RACTV<0> to RACTV<7> are sequentially activated, the driving control pulses ENPULSE23, ENPULSE45, and ENPULSE67 corresponding to the second to seventh banks 32 to 37 as well as the driving control pulse ENPULSE01 corresponding to the 0-th and first banks (30 and 31) may also be toggled to drive the core voltage terminals corresponding to the second to seventh banks 32 to 37 as well as the core voltage terminals corresponding to the 0-th and first banks 30 and 31.

That is, when the read command signal RD0 or RD1 is applied to read the data stored in the 0-th or first bank (30 or 31), only the core voltage terminals of the 0-th and first banks 30 and 31 may be driven. However, the core voltage terminals of the second to seventh banks 32 to 37, which are not objects of the intended operation, may be unnecessarily driven when the second to seventh banks 32 to 37 are activated in correspondence to the active command signals ACT_CMD before the read command signal RD0 or RD1 is applied.

When the core voltage terminals of the second to seventh banks 32 to 37 are unnecessarily driven perform an operation, current consumption may increase.

SUMMARY OF THE INVENTION

An exemplary embodiment of the present invention is directed to a semiconductor memory device including a circuit for controlling a core voltage driver which selectively drives core voltage terminals corresponding to a plurality of banks, including when read and write command signals are applied as well as when an active command signal is applied.

In accordance with an embodiment of the present invention, a semiconductor memory device includes a plurality of banks, a first bank selection driving control signal generation unit configured to generate a plurality of first bank selection driving control signals corresponding to the plurality of banks in response to an active command signal and an address signal, a second bank selection driving control signal generation unit configured to generate a plurality of second bank selection driving control signals corresponding to the plurality of banks in response to one of a read command signal and a write command signal and in response to the address signal, and an internal voltage driver configured to selectively drive a plurality of internal voltage terminals corresponding to the plurality of banks in response to the plurality of first bank selection driving control signals and the plurality of second bank selection driving control signals.

In accordance with another embodiment of the present invention, a method for operating a semiconductor memory device including a plurality of banks includes performing a first activation operation of activating a first bank selection driving control signal of a plurality of first bank selection driving control signals in response to an active command signal and an address signal, performing a second activation operation of activating a second bank selection control signal of a plurality of second bank selection driving control signals in response to one of a read command signal and a write command signal and in response to the address signal, performing a first driving operation of driving an internal voltage terminal of a bank corresponding to the address signal among the plurality of banks for a length of time in response to the first bank selection driving control signal being activated by the performing of the first activation operation, and performing a second driving operation of driving the internal voltage terminal of the bank corresponding to the address signal among the plurality of banks for a length of time in response to the second bank selection driving control signal being activated by the performing of the second activation operation in an interval in which the activated state of the first bank selection driving control signal.

DESCRIPTION OF EXEMPLARY EMBODIMENTS

Figure 1:
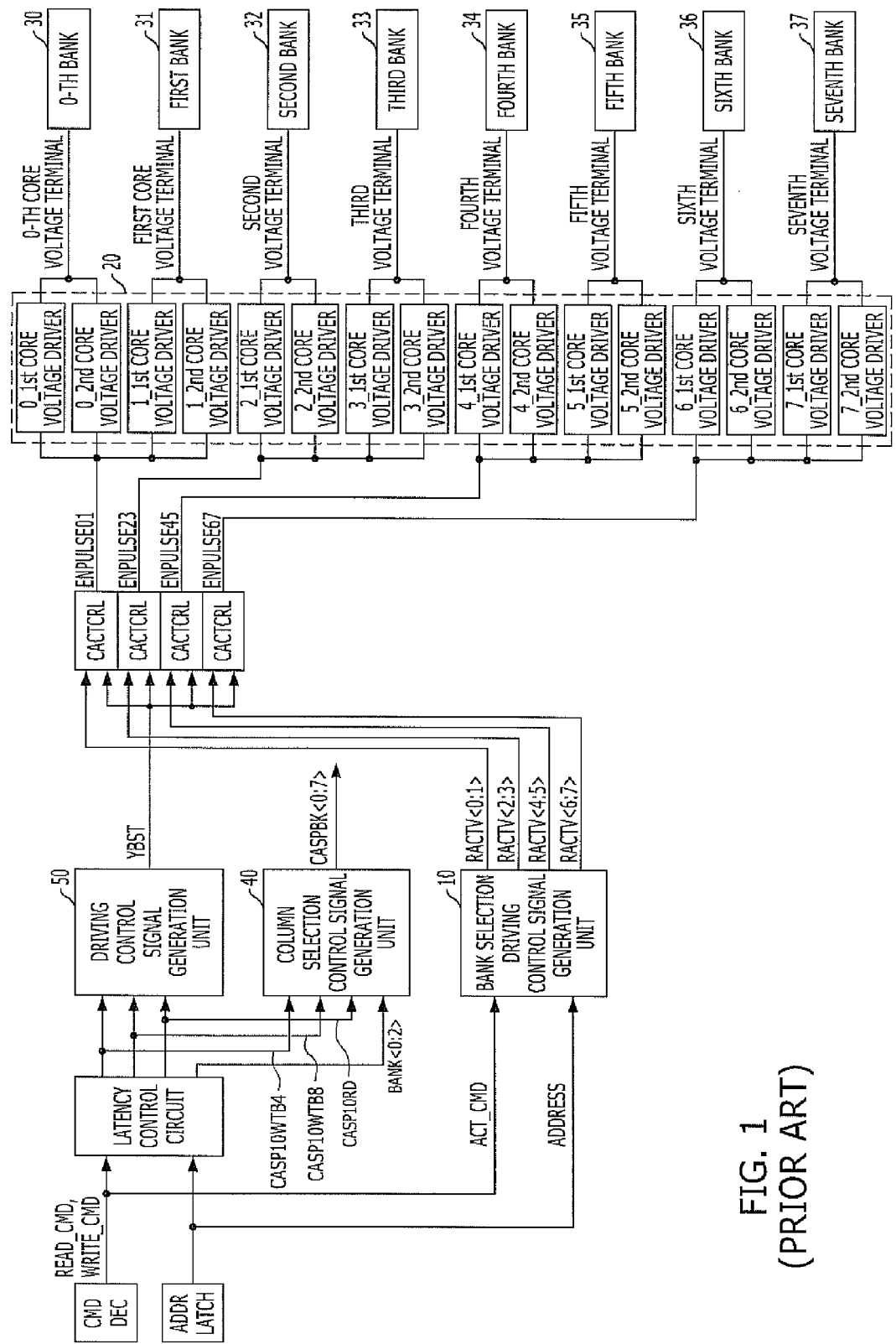
FIG. 1 is a block diagram illustrating a circuit for controlling a core voltage driver in a conventional memory device.
Figure 2:
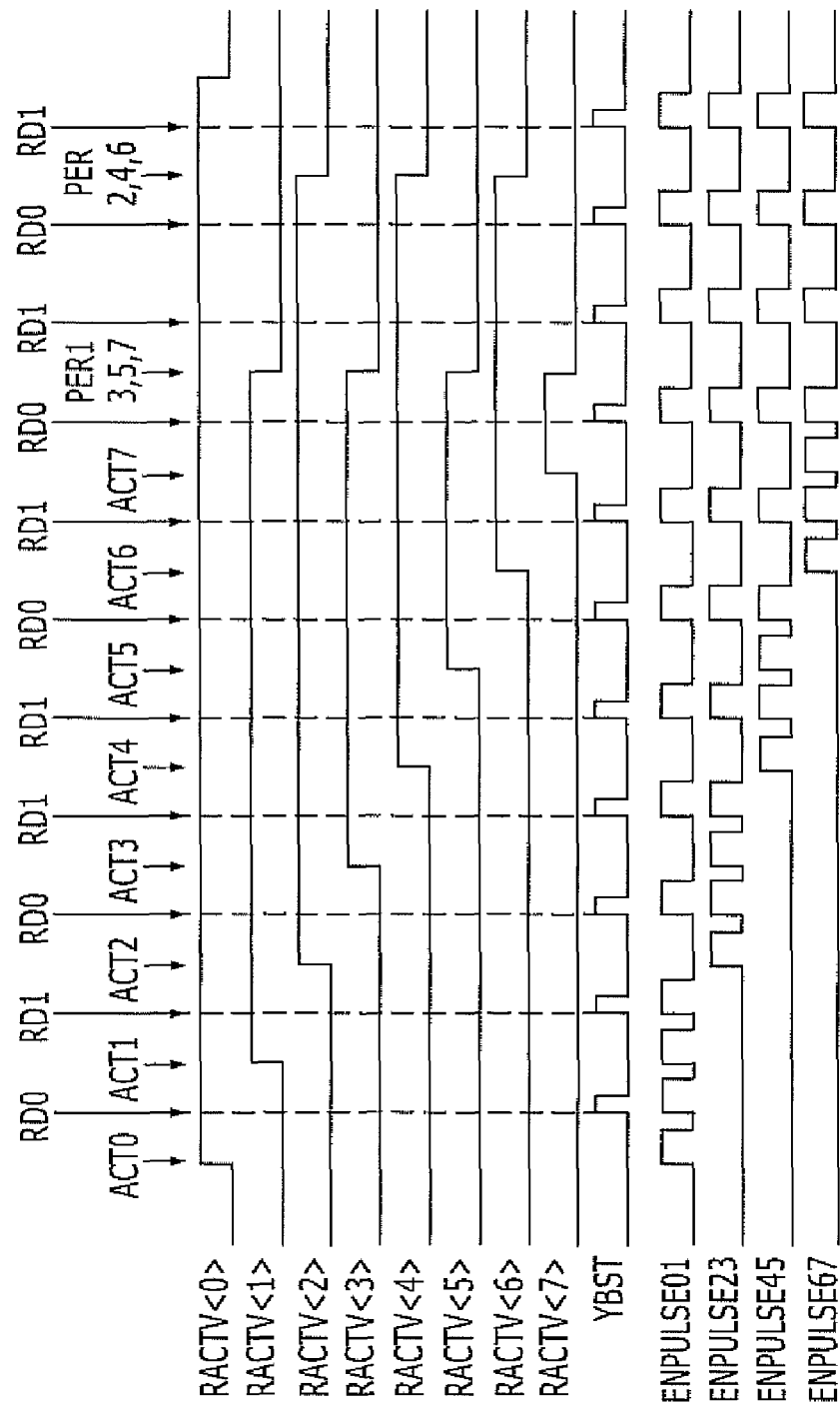
FIG. 2 is a timing diagram showing the operation of the circuit for controlling the core voltage driver in the conventional semiconductor memory device illustrated in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will fully enable those having ordinary skill in the art to practice the invention without undue experimentation. Throughout the disclosure, like reference numerals refer to like parts throughout the various figures and embodiments of the present invention.

Figure 3:
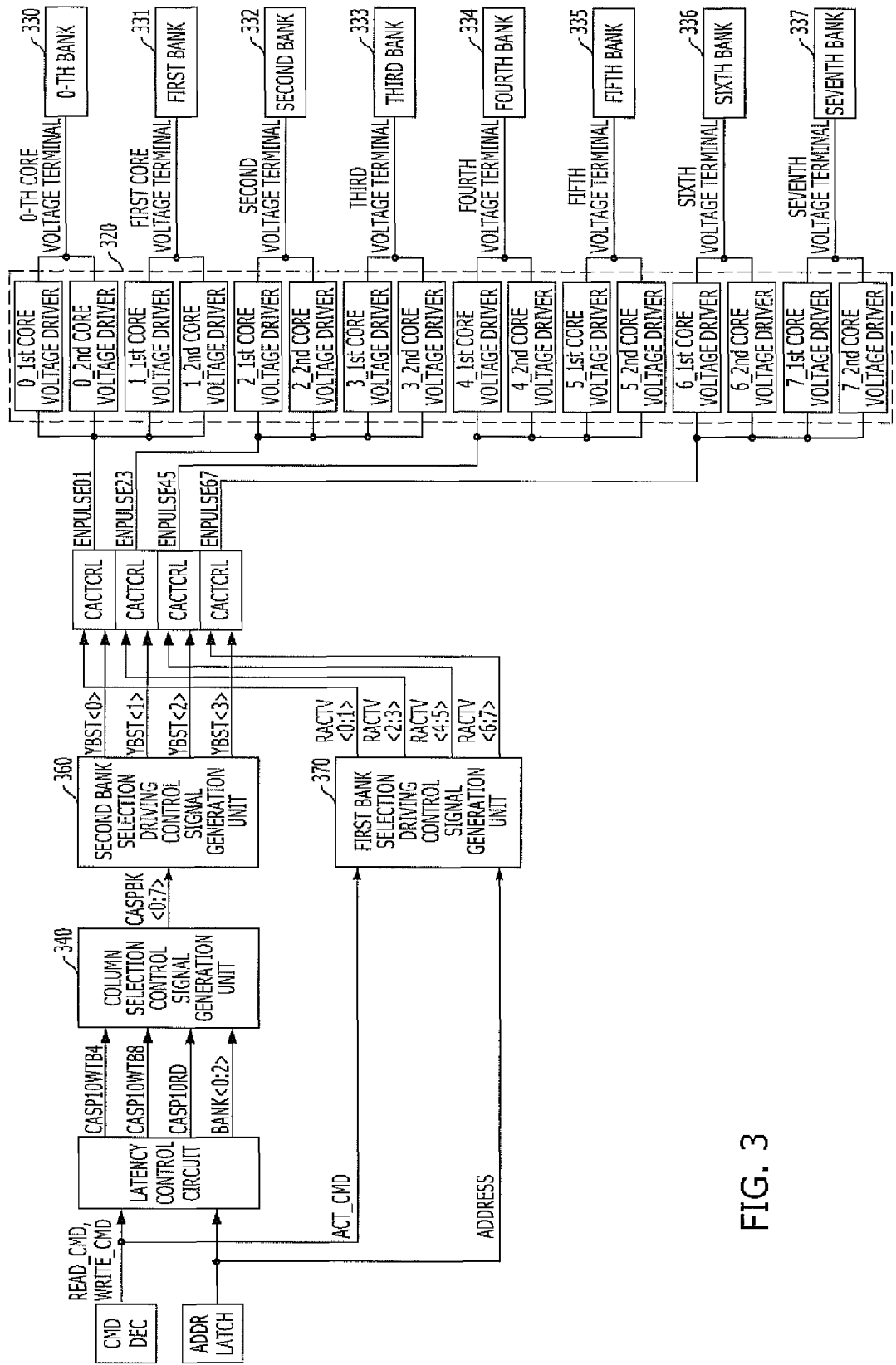
FIG. 3 is a block diagram illustrating a circuit for controlling a core voltage driver in a semiconductor memory device in accordance with an embodiment of the present invention.

FIG. 3 is a block diagram illustrating a circuit for controlling a core voltage driver in a semiconductor memory device in accordance with an exemplary embodiment of the present invention.

Referring to FIG. 3, the circuit for controlling a core voltage driver in the semiconductor memory device including a plurality of banks 330 to 337 in accordance with the embodiment of the present invention includes a first bank selection driving control signal generation unit 370, a second bank selection driving control signal generation unit 360, and a core voltage driver 320. The first bank selection driving control signal generation unit 370 is configured to generate a plurality of first bank selection driving control signals (RACTV<0:1>, RACTV<2:3>, RACTV<4:5>, and RACTV<6:7>) corresponding to the plurality of banks (330 to 337) in response to an active command signal ACT_CMD and an address signal ADDRESS. The second bank selection driving control signal generation unit 360 is configured to generate a plurality of second bank selection driving control signals (YBST<0> to YBST<3>) corresponding to the plurality of banks (330 to 337) in response to a read control signal CASP10RD corresponding to a read command signal READ_CMD, write control signals CASP10WTB4 and CASP10WTB8 corresponding to a write command signal WRITE_CMD, and bank selection control signals BANK<0:2> corresponding to the address signal ADDRESS. The core voltage driver 320 is configured to selectively drive a plurality of core voltage terminals corresponding to the plurality of banks (330 to 337) in response to the plurality of first bank selection driving control signals (RACTV<0:1>, RACTV<2:3>, RACTV<4:5>, and RACTV<6:7>) and the plurality of second bank selection driving control signals (YBST<0> to YBST<3>).

Furthermore, the circuit for controlling a core voltage driver 320 includes a column selection control signal generation unit 340 that is configured to generate a plurality of column selection control signals CASPBK<0:7> for selecting any one of the plurality of banks 330 to 337, in which a column selection operation is to be performed, in response to the read control signal CASP10RD corresponding to the read command signal READ_CMD, in response to either one of the write control signals CASP10WTB4 and CASP10WTB8 corresponding to the write command signal WRITE_CMD, and in response to either of the bank selection control signals BANK<0:2> corresponding to the address signal ADDRESS.

The first bank selection driving control signal generation unit 370 selects any one of the plurality of banks 330 to 337 as a first corresponding bank in response to the address signal ADDRESS, and activates a first bank selection driving control signal, corresponding to the first corresponding bank, from among the plurality of first bank selection driving control signals (RACTV<0:1>, RACTV<2:3>, RACTV<4:5>, and RACTV<6:7>), activated in response to the active command signal ACT_CMD.

For example, when the first corresponding bank is the third bank 333, the third signal RACTV<3> corresponding to the third bank 333 is activated in response to active command signal ACT_CMD.

Similarly, when the first corresponding bank is the fifth bank 335, the fifth signal RACTV<5> corresponding to the fifth bank 335 is activated in response to the active command signal ACT_CMD.

The column selection control signal generation unit 340 and the second bank selection driving control signal generation unit 360 generate new signals which indicate the plurality of column selection control signals CASPBK<0:7> and the plurality of second bank selection driving control signals (YBST<0> to YBST<3>) in response the read control signal CASP10RD corresponding to the read command signal READ_CMD, the write control signals CASP10WTB4 and CASP10WTB8 corresponding to the write command signal WRITE_CMD, and the bank selection control signals BANK<0:2> corresponding to the address signal ADDRESS. The circuit may be constructed as illustrated in FIG. 1 in that the generated new signals include information for selecting any one of the plurality of banks (330 to 337).

That is, the circuit for controlling the core voltage driver 320 may be constructed in such a manner that the column selection control signal generation unit 340 directly receives the read control signal CASP10RD corresponding to the read command signal READ_CMD, the write control signals CASP10WTB4 and CASP10WTB8 corresponding to the write command signal WRITE_CMD, and the bank selection control signals BANK<0:2> corresponding to the address signal ADDRESS to generate the column selection control signals CASPBK<0:7> and the second bank selection driving control signal generation unit 360 receives the column selection control signals CASPBK<0:7> generated by the column selection control signal generation unit 340 to generate the second bank selection driving control signals (YBST<0> to YBST<3>).

In this embodiment, the second bank selection driving control signal generation unit 360 does not directly receive the read control signal CASP10RD corresponding to the read command signal READ_CMD, the write control signals CASP10WTB4 and CASP10WTB8 corresponding to the write command signal WRITE_CMD, and the bank selection control signals BANK<0:2> corresponding to the address signal ADDRESS. The column selection control signal generation unit 340 is positioned before the second bank selection driving control signal generation unit 360 where the column selection control signals CASPBK<0:7> generated by the column selection control signal generation unit 340 are more data than the second bank selection driving control signal YBST<0> to YBST<3> in terms of the bits of information.

According to an alternative embodiment, however, the circuit for controlling the core voltage driver 320 may be implemented in such a manner that the column selection control signal generation unit 340 directly receives the read control signal CASP10RD corresponding to the read command signal READ_CMD, the write control signals CASP10WTB4 and CASP10WTB8 corresponding to the write command signal WRITE_CMD, and the bank selection control signals BANK<0:2> corresponding to the address signal ADDRESS to generate the column selection control signals CASPBK<0:7> and the second bank selection driving control signal generation unit 360 also directly receives the read control signal CASP10RD corresponding to the read command signal READ_CMD, the write control signals CASP10WTB4 and CASP10WTB8 corresponding to the write command signal WRITE_CMD, and the bank selection control signals BANK<0:2> corresponding to the address signal ADDRESS to generate the second bank selection driving control signals YBST<0> to YBST<3>.

For reference, the column selection control signals CASPBK<0:7> and the second bank selection driving control signals YBST<0> to YBST<3> are matched two to one in such a manner that the second bank selection driving control signal generation unit 360 receives the column selection control signals CASPBK<0:7> generated by the column selection control signal generation unit 340 to generate the second bank selection driving control signals YBST<0> to YBST<3>.

For example, the 0-th and first column selection control signals CASPBK<0> and CASPBK<1> correspond to the 0-th signal YBST<0>, the second and third column selection control signals CASPBK<2> and CASPBK<3> correspond to the first signal YBST<1>, the fourth and fifth column selection control signals CASPBK<4> and CASPBK<5> correspond to the second signal YBST<2>, and the sixth and seventh column selection control signals CASPBK<6> and CASPBK<7> correspond to the third signal YBST<3>.

Therefore, the operation of the second bank selection driving control signal generation unit 360 may be two different ways as follows.

First, in the configuration of the second bank selection driving control signal generation unit 360 shown in FIG. 3, any one of the banks 330 to 337 is selected as a second corresponding bank in response to the address signal ADDRESS. Based on such a selection, when a column selection control signal corresponding to the second corresponding bank among the column selection control signals CASPBK<0:7> generated by the column selection control signal generation unit 340 is activated in response to the activation of any one of the read command signal READ_CMD and the write command signal WRITE_CMD, a second bank selection driving control signal is activated from among the second bank selection driving control signals YBST<0> to YBST<3>.

For example, if the second corresponding bank is the first bank 331, the first column selection control signal CASPBK<1> corresponding to the first bank 331 generated by the column selection control signal generation unit 340 is activated in response to the activation of any one of the read command signal READ_CMD and the write command signal WRITE_CMD. In response to the activation of the first column selection control signal CASPBK<1>, the 0-th signal YBST<0> corresponding to the first column selection control signal CASPBK<1> is activated.

Similarly, if the second corresponding bank is the fifth bank 335, the fifth column selection control signal CASPBK<5> corresponding to the fifth bank 335 generated by the column selection control signal generation unit 340 is activated in response to the activation of any one of the read command signal READ_CMD and the write command signal WRITE_CMD. In response to the activation of the fifth column selection control signal CASPBK<5>, the second signal YBST<2> corresponding to the fifth column selection control signal CASPBK<5> is activated.

Second, in a configuration of the second bank selection driving control signal generation unit 360 configured in a different manner from that illustrated in FIG. 3, any one of the banks 330 to 337 is selected as a second corresponding bank in response to the address signal ADDRESS, and a second bank selection driving control signal corresponding to the second corresponding bank is activated in response to activation of any one of the read command signal READ_CMD and the write command signal WRITE_CMD.

For example, if the second corresponding bank is the first bank 331, the 0-th signal YBST<0> corresponding to the first bank 331 is activated in response to the activation of any one of the read command signal READ_CMD or the write command signal WRITE_CMD.

Similarly, if the second corresponding bank is the fifth bank 335, the second signal YBST<2> corresponding to the fifth bank 335 is activated in response to the activation of any one of the read command signal READ_CMD and the write command signal WRITE_CMD.

A driving control pulse generator CACTCRL toggles a driving control pulse (ENPULSE01, ENPULSE23, ENPULSE45, or ENPULSE67) corresponding to the first corresponding bank, and the core voltage driver 320, which responds to the toggling of the driving control pulse corresponding to the first corresponding bank, drives a core voltage terminal corresponding to the first corresponding bank, in response to the activation of the first bank selection driving control signal (RACTV<0:1>, RACTV<2:3>, RACTV<4:5>, or RACTV<6:7>) corresponding to the first corresponding bank, regardless of whether the second bank selection driving control signal (YBST<0> to YBST<3>) corresponding to the first corresponding bank is activated or not.

For example, when the seventh signal RACTV<7> corresponding to the seventh bank 337 is activated in a state in which the first corresponding bank is the seventh bank 337, the fourth driving control pulse ENPULSE67 corresponding to the seventh bank 337 is toggled to drive the core voltage terminal corresponding to the seventh bank 337, regardless of whether the third signal YBST<3> corresponding to the seventh bank 337 is activated or deactivated.

Similarly, when the second signal RACTV<2> corresponding to the second bank 332 is activated in a state in which the first corresponding bank is the second bank 332, the second driving control pulse ENPULSE23 corresponding to the second bank 332 is toggled to drive the core voltage terminal corresponding to the second bank 332, regardless of whether the first signal YBST<1> corresponding to the second bank 332 is activated or deactivated.

The core voltage driver 320, which is responsive to a toggling of a driving control pulse (ENPULSE01, ENPULSE23, ENPULSE45, or ENPULSE67) corresponding to the second corresponding bank, drives a core voltage terminal corresponding to the second corresponding bank in response to the activation of the second bank selection driving control signal (YBST<0> to YBST<3>) corresponding to the second corresponding bank when the first bank selection driving control signal (RACTV<0:1>, RACTV<2:3>, RACTV<4:5>, and RACTV<6:7>) corresponding to the second corresponding bank is activated.

For example, when the sixth signal RACTV<6> corresponding to the sixth bank 336 is activated in a state in which the second corresponding bank is the sixth bank 336, the core voltage driver 320, which is responsive to the toggling of the fourth driving control pulse ENPULSE67 corresponding to the sixth bank 336, drives the core voltage terminal corresponding to the sixth bank 336 in response to the activation of the third signal YBST<3> corresponding to the sixth bank 336.

Similarly, when the second signal RACTV<2> corresponding to the second bank 332, the core voltage driver 320 toggles the second driving control pulse ENPULSE23 corresponding to the second bank 332 to drive the core voltage terminal corresponding to the second bank 332 in response to the activation of the first signal YBST<1> corresponding to the second bank 332 among the second bank selection driving control signals (YBST<0> to YBST<1>).

On the other hand, when the first bank selection driving control signal (RACTV<0:1>, RACTV<2:3>, RACTV<4:5>, or RACTV<6:7>) corresponding to the second corresponding bank is deactivated, the core voltage driver 320 cannot toggle the driving control pulse (ENPULSE01, ENPULSE23, ENPULSE45, or ENPULSE67) corresponding to the second corresponding bank, regardless of whether the second bank selection driving control signal (YBST<0> to YSBT<3>) corresponding to the second corresponding bank is activated or deactivated. Accordingly, the core voltage terminal corresponding to the second corresponding bank is not driven.

For example, when the sixth signal RACTV<6> corresponding to the sixth bank 336 is deactivated in a state in which the second corresponding bank is the sixth bank 336, the core voltage driver 320 cannot toggle the fourth driving control pulse ENPULSE67 corresponding to the sixth bank 336, regardless of whether the third signal YBST<3> corresponding to the sixth bank 336 is activated or deactivated. Accordingly, the core voltage terminal corresponding to the sixth bank 336 is not driven.

Similarly, when the second signal RACTV<2> corresponding to the second bank 332 is deactivated in a state in which the second corresponding bank is the second bank 332, the core voltage driver 320 cannot toggle the second driving control pulse ENPULSE23 corresponding to the second bank 332, regardless of whether the first signal YBST<1> corresponding to the second bank 332 is activated or deactivated. Accordingly, the core voltage terminal corresponding to the second bank 332 is not driven.

As described above, the first and second corresponding banks among the plurality of banks (330 to 337) may be the same bank or different banks depending on the inputted address signal ADDRESS.

That is, the first and second corresponding banks may be independently or simultaneously selected.

Figure 4:
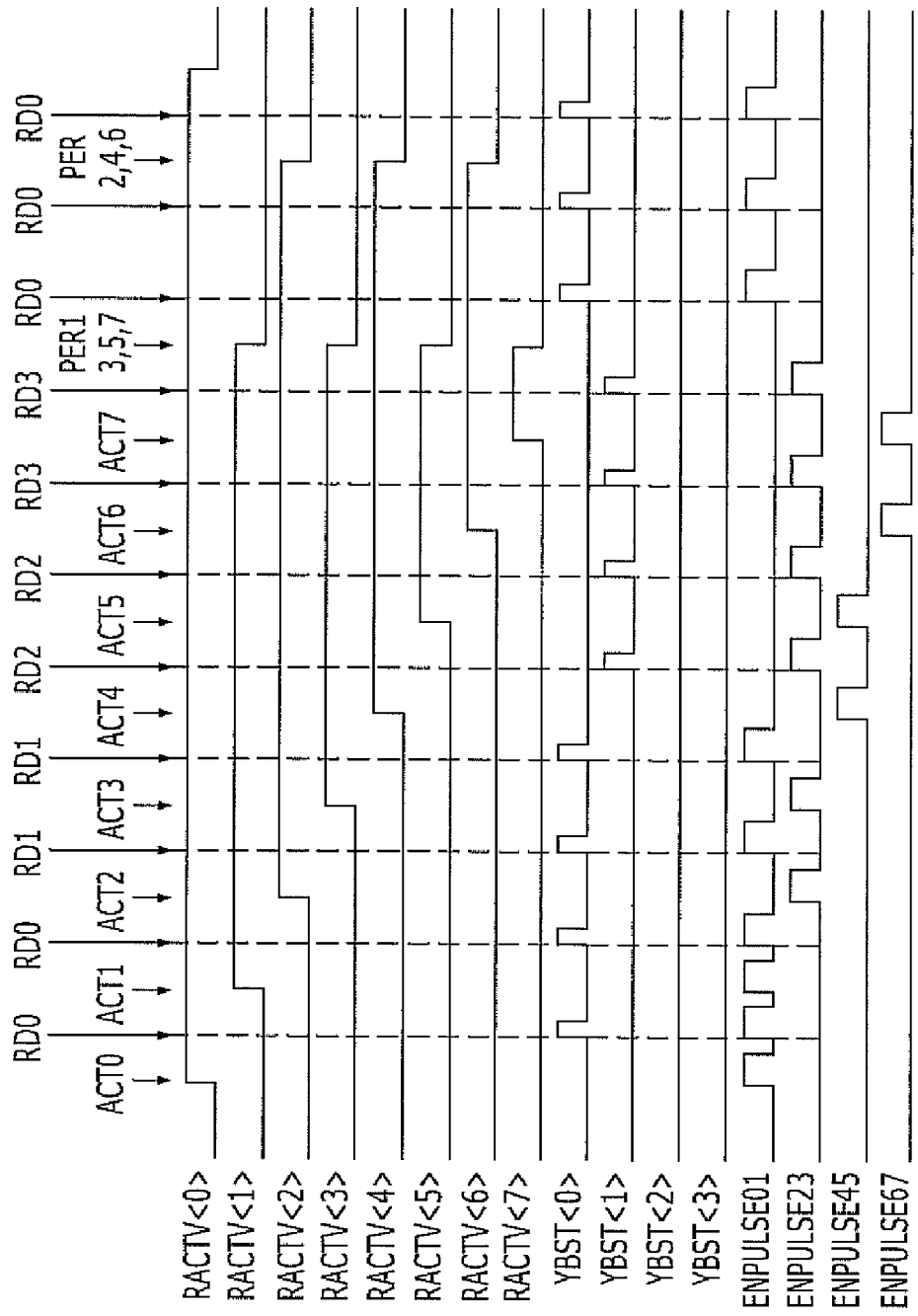
FIG. 4 is a timing diagram showing the operation of the circuit for controlling the core voltage driver in the semiconductor memory device illustrated in FIG. 3.

FIG. 4 is a timing diagram showing the operation of the circuit for controlling the core voltage driver in the semiconductor memory device illustrated in FIG. 3.

Referring to FIG. 4, the circuit for controlling the core voltage driver 320 in the semiconductor memory device including the plurality of banks (330 to 337), in accordance with this embodiment of the present invention, sequentially activates the plurality of first bank selection driving control signals RACTV<0> to RACTV<7>, as the plurality of active command signals ACT0 to ACT7 corresponding to the plurality of banks 330 to 337 are sequentially activated. Then, while the plurality of driving control pulses ENPULSE01, ENPULSE23, ENPULSE45, and ENPULSE67 are sequentially toggled, the circuit sequentially drives the core voltage terminals corresponding to the plurality of banks (330 to 337).

Furthermore, while the plurality of active command signals ACT0 to ACT7 corresponding to the plurality of banks 330 to 337 are sequentially activated, the read command signals RD0 to RD3 for reading the data stored in the 0-th to third banks 330 to 333 are selectively applied. Accordingly, the first and second signals YBST<0> and YBST<1> are toggled.

As such, the control may be performed in such a manner that only the first signal YBST<0> among the plurality of second bank selection driving control signals YBST<0> to YBST<3> is toggled in response to the application of the read command signal (RD0 or RD1) for reading the data stored in the 0-th or first bank (330 or 331) and only the second signal YBST<1> among the plurality of second bank selection driving control signals YBST<0> to YBST<3> is toggled in response to the application of the read command signal (RD2 or RD3) for reading the data stored in the second or third bank (332 or 333). In this case, when the 0-th and first signals (RACTV<0> and RACTV<1>) corresponding to the 0-th and first banks (330 and 331) are activated, only the driving control pulse ENPULSE01 corresponding to the 0-th and first banks (330 and 331) is toggled and the other driving control pulses (ENPULSE23, ENPULSE45, and ENPULSE67) corresponding to the second to seventh banks (332 to 337) are not toggled, when the read command signal (RD0 or RD1) for reading the data stored in the 0-th or first bank (330 or 331) is applied. Therefore, the core voltage terminals corresponding to the 0-th and first banks (330 and 331) may be driven with optimal efficiency.

Similarly, when only the second and third signals (RACTV<2> and RACTV<3>) corresponding to the second and third banks (332 and 333 among the plurality of first bank selection driving control signals RACTV<0> to RACTV<7> are activated, only the driving control pulse ENPULSE23 corresponding to the second and third banks (332 and 333) is toggled and the other driving control pulses ENPULSE01, ENPULSE45, and ENPULSE67 corresponding to the 0-th and first banks (330 and 331) and the fourth to seventh banks (334 to 337) are not toggled, when the read command signal (RD2 or RD3) for reading the data stored in the second or third bank (332 or 333) is applied. Therefore, the core voltage terminals corresponding to the second and third banks (332 and 333) may be driven with optimal efficiency.

The operation of the circuit for controlling the core voltage driver in the semiconductor memory device including the plurality of banks 330 to 337 in accordance with the embodiment of the present invention may include the following steps.

The operation may include a step of generating any one of the plurality of first bank selection driving control signals (RACTV<0> to RACTV<7>) as a first driving control signal in response to the active command signal ACT_CMD and a first address signal of the address signal ADDRESS, a step of generating any one of the plurality of first bank selection driving control signals (RACTV<0> to RACTV<7>) as a second driving control signal in response to the active command signal ACT_CMD and a second address signal of the address signal ADDRESS, a step of generating any one of the second bank selection driving control signals (YBST<0> to YBST<3>) as a third driving control signal in response to any one of the read command signal READ_CMD and the write command signal WRITE_CMD and the first address signal of the address signal ADDRESS, a step of generating any one of the plurality of second bank selection driving control signals (YBST<0> to YBST<3>) as a fourth driving control signal in response to any one of the read command signal READ_CMD and the write command signal WRITE_CMD and the second address signal of the address signal ADDRESS, a step of driving a core voltage terminal of a bank corresponding to the first address among the plurality of banks (330 to 337) in response to the first driving control signal and the third driving control signal, and a step of driving a core voltage terminal of a bank corresponding to the second address among the plurality of banks (330 to 337) in response to the second driving control signal and the fourth driving control signal.

At this time, the bank corresponding to the first address signal and the bank corresponding to the second address signal among the plurality of banks (330 to 337) may be the same bank or different banks.

When the bank corresponding to the first address signal and the bank corresponding to the second address signal are the same bank, the first driving control signal and the second driving control signal indicate the same first bank selection driving control signal. In this case, the step of generating the first driving control signal and the step of generating the second driving control signal are the same step.

Similarly, when the bank corresponding to the first address signal and the bank corresponding to the second address signal are the same bank, the third driving control signal and the fourth driving control signal indicate the same second bank selection driving control signal. In this case, the step of generating the third driving control signal and the step of generating the fourth driving control signal are the same step.

However, when the bank corresponding to the first address signal and the bank corresponding to the second address signal are different banks, the first driving control signal and the second driving control signal indicate different first bank selection driving control signals. In this case, the step of generating the first driving control signal and the step of generating the second driving control signal are different steps.

Similarly, when the bank corresponding to the first address signal and the bank corresponding to the second address signal are different banks, the third driving control signal and the fourth driving control signal indicate different second bank selection driving control signals. In this case, the step of generating the third driving control signal and the step of generating the fourth driving control signal are different steps.

The step of generating the first driving control signal may be described in more detail as follows. When the first driving control signal is transferred to the first bank selected in correspondence to the first address signal, the first driving control signal is activated in response to the active command signal ACT_CMD.

The step of generating the third driving control signal may be described in more detail as follows. When the third driving control signal is transferred to the first bank selected in correspondence to the first address signal, the third driving control signal is activated in response to the activation of any one of the read command signal READ_CMD and the write command signal WRITE_CMD.

The step of driving the core voltage terminal of the bank corresponding to the first address may be described in more detail as follows. The step may include a step of driving the core voltage terminal of the first bank in response to the activation of the first driving control signal transferred to the first bank corresponding to the first address signal, a step of driving the core voltage terminal of the first bank in response to the activation of the third driving control signal in a state in which the first driving control signal transferred to the first bank corresponding to the first address signal is activated, and a step of disabling the core voltage terminal of the first bank regardless of whether or not the third driving control signal is activated in a state in which the first driving control signal transferred to the first bank corresponding to the first address signal is deactivated.

The step of generating the second driving control signal may be described in more detail as follows. When the second driving control signal is transferred to the second bank selected in correspondence to the second address signal among the plurality of banks 330 to 337, the second driving control signal is activated in response to the activation of the active command signal ACT_CMD.

The step of generating the fourth driving control signal may be described in more detail as follows. When the fourth driving control signal is transferred to the second bank selected in correspondence to the second address signal among the plurality of banks 330 to 337, the fourth driving control signal is activated in response to the activation of any one of the read command signal READ_CMD and the write command signal WRITE_CMD.

The step of driving the core voltage terminal of the bank corresponding to the second address may be described in more detail as follows. The step may include a step of driving the core voltage terminal of the second bank in response to the activation of the second driving control signal transferred to the second bank corresponding to the second address signal, a step of driving the core voltage terminal of the second bank in response to the activation of the fourth driving control signal in a state in which the second driving control signal transferred to the second bank corresponding to the second address signal is activated, and a step of disabling the core voltage terminal of the second bank regardless of whether or not the fourth driving control signal is activated in a state in which the second driving control signal transferred to the second bank corresponding to the second address signal is deactivated.

In accordance with the above-described embodiment of the present invention, when the active command signal ACT_CMD is applied to generate driving control signals for driving the core voltage terminals corresponding to the plurality of banks 330 to 337, the driving control signals may be set to the plurality of first bank selection driving control signals (RACTV<0> to RACTV<7>) which are selectively activated in response to the address signal ADDRESS. Therefore, the plurality of banks (330 to 337) may be driven selectively.

Simultaneously, even when any one of the read command signal READ_CMD and the write command signal WRITE_CMD is applied to generate driving control signals for driving the core voltage terminals corresponding to the plurality of banks (330 to 337), the driving control signals may be set to the plurality of second bank selection driving control signals YBST<0> to YBST<3> which are selectively activated in response to the address signal ADDRESS. Therefore, the plurality of banks 330 to 337 may be driven selectively.

Accordingly, regardless of which one of the active command signal ACT_CMD, the read command signal READ_CMD, and the write command signal WRITE_CMD is applied, only the core voltage terminals of banks which actually operate may be selected and driven.

That is, the core voltage terminals corresponding to the plurality of banks (330 to 337) may be driven with optimal efficiency, regardless of the types of the command signals. Accordingly, the current consumption can be reduced/minimized.

In accordance with the embodiments of the present invention, when the read and write signals are applied to generate driving control signals for driving the core voltage terminals corresponding to the plurality of banks, the driving control signals may be selectively activated in response to the address signal, depending on the plurality of banks. Therefore, even when the read and write signals are applied as well as when the active command signal is applied, the core voltage terminal corresponding to the plurality of banks may be selectively driven. Accordingly, the core voltage terminals corresponding to the plurality of banks may be driven with optimal efficiency, which results in reduction/minimization of the current consumption.

While the present invention has been described with respect to the exemplary embodiments, it will be apparent to those skilled in the art that various changes and modifications may be made without departing from the spirit and scope of the invention as defined in the following claims and the equivalents thereof.

What is claimed is:

1. A semiconductor memory device comprising:
 a plurality of banks;
 a first bank selection driving control signal generation unit configured to generate a plurality of first bank selection driving control signals corresponding to the plurality of banks in response to an active command signal and an address signal;
 a second bank selection driving control signal generation unit configured to generate a plurality of second bank selection driving control signals corresponding to the plurality of banks in response to one of a read command signal and a write command signal and in response to the address signal; and
 an internal voltage driver configured to selectively drive a plurality of internal voltage terminals corresponding to the plurality of banks in response to the plurality of first bank selection driving control signals and the plurality of second bank selection driving control signals.

2. The semiconductor memory device of claim 1, wherein the first bank selection driving control signal generation unit is configured to select a bank of the plurality of banks as a first corresponding bank in response to the address signal, and activate a first bank selection driving control signal corresponding to the first corresponding bank among the plurality of first bank selection driving control signals in response to an activation of the active command signal.

3. The semiconductor memory device of claim 2, wherein the second bank selection driving control signal generation unit is configured to select a bank of the plurality of banks as a second corresponding bank in response to the address signal, and activate a second bank selection driving control signal corresponding to the second corresponding bank among the plurality of second bank selection driving control signals in response to an activation of one of the read command signal and the write command signal.

4. The semiconductor memory device of claim 3, wherein the internal voltage driver is configured to (1) drive an internal voltage terminal corresponding to the first corresponding bank in response to the activation of the first bank selection driving control signal corresponding to the first corresponding bank, (2) drive an internal voltage terminal corresponding to the second corresponding bank in response to the activation of the second bank selection driving control signal corresponding to the second corresponding bank when the first bank selection driving control signal corresponding to the second corresponding bank is activated, and (3) disable the internal voltage terminal corresponding to the second corresponding bank when the first bank selection driving control signal corresponding to the second corresponding bank is deactivated, regardless of whether the second bank selection driving control signal corresponding to the second corresponding bank is activated or not.

5. The semiconductor memory device of claim 4, wherein the first corresponding bank and the second corresponding bank are the same bank.

6. The semiconductor memory device of claim 4, wherein first corresponding bank and the second corresponding bank are different banks.

7. A method for operating a semiconductor memory device comprising a plurality of banks, the method comprising:
   performing a first activation operation of activating a first bank selection driving control signal of a plurality of first bank selection driving control signals in response to an active command signal and an address signal;
   performing a second activation operation of activating a second bank selection control signal of a plurality of second bank selection driving control signals in response to one of a read command signal and a write command signal and in response to the address signal;
   performing a first driving operation of driving an internal voltage terminal of a bank corresponding to the address signal among the plurality of banks for a length of time in response to the first bank selection driving control signal being activated by the performing of the first activation operation; and
   performing a second driving operation of driving the internal voltage terminal of the bank corresponding to the address signal among the plurality of banks for a length of time in response to the second bank selection driving control signal being activated by the performing of the second activation operation in an interval in which the activated state of the first bank selection driving control signal is maintained.

8. The method of claim 7, wherein the performing of the first activation operation comprises:
   activating one of the plurality of first bank selection driving control signals as a first driving control signal in response to the active command signal and a first signal of the address signal; and
   activating one of the first bank selection driving control signals other than the first bank selection driving control signal corresponding to the first driving control signal as a second driving control signal in response to the active command signal and a second signal of the address signal.

9. The method of claim 8, wherein the performing of the second activation operation includes:
   activating one of the plurality of second bank selection driving control signals as a third driving control signal in response to one of the read command signal and the write command signal and in response to the first signal of the address signal; and
   activating one of the second bank selection driving control signals other than the second bank selection driving control signal corresponding to the third driving control signal as a fourth driving control signal in response to one of the read command signal and the write command signal and in response to the second signal of the address signal.

10. The method of claim 9, wherein the performing of the first driving operation comprises:
    driving an internal voltage terminal of a first bank corresponding to the first signal of the address signal among the plurality of banks for a length of time in response to the activation of the first driving control signal; and
    driving an internal voltage terminal of a second bank corresponding to the second signal of the address signal among the plurality of banks for a length of time in response to the activation of the second driving control signal.

11. The method of claim 10, wherein the performing of the second driving operation comprises:
    driving the internal voltage terminal of the first bank for a length of time in response to when the third driving control signal is toggled in an interval in which the activation state of the first driving control signal is maintained; and
    driving the internal voltage terminal of the second bank for a length of time in response to when the fourth driving control signal is toggled in an interval in which the activation state of the second driving control signal is maintained.

12. The method of claim 9, wherein the activating of one of the plurality of first bank selection driving control signals as a first driving control signal includes transferring the first driving control signal to the first bank selected in correspondence to the first signal of the address signal among the plurality of banks, and activating the first driving control signal in response to when the active command signal is toggled.

13. The method of claim 12, the activating of one of the first bank selection driving control signals other than the first bank selection driving control signal corresponding to the first driving control signal as a second driving control signal includes transferring the second driving control signal to the second bank selected in correspondence to the second signal of the address signal among the plurality of banks, and activating the second driving control signal in response to when the active command signal is toggled.

14. The method of claim 13, wherein the activating of any one of the plurality of second bank selection driving control signals as a third driving control signal includes transferring the third driving control signal to the first bank selected in correspondence to the first signal of the address signal among the plurality of banks and toggling the third driving control signal in response to when one of the read command signal and the write command signal is toggled.

15. The method of claim 14, wherein the activating of any one of the second bank selection driving control signals other than the second bank driving control signal corresponding to the third driving control signal as a fourth driving control signal includes transferring the fourth driving control signal to the second bank selected in response to the second signal of the address signal among the plurality of banks, and toggling the fourth driving control signal in response to when one of the read command signal and the write command signal is toggled.

* * * * *